United States Patent [19]
Ginetti

[11] Patent Number: 6,163,289
[45] Date of Patent: Dec. 19, 2000

[54] DIFFERENTIAL VOLTAGE DIGITAL-TO-ANALOG CONVERTER

[75] Inventor: Bernard Ginetti, Antibes, France

[73] Assignee: Philips Electronics North America Corp., New York, N.Y.

[21] Appl. No.: 09/158,759

[22] Filed: Sep. 23, 1998

Related U.S. Application Data

[60] Provisional application No. 60/060,692, Sep. 23, 1997.

[51] Int. Cl.[7] .................................................. H03M 1/66
[52] U.S. Cl. ............................................ 341/145; 341/154
[58] Field of Search .................................... 341/118, 145, 341/154, 159

[56] References Cited

U.S. PATENT DOCUMENTS

| | | | |
|---|---|---|---|
| 5,014,054 | 5/1991 | Oshita et al. | 341/145 |
| 5,126,740 | 6/1992 | Kawada | 341/144 |
| 5,568,146 | 10/1996 | Park | 341/145 |

*Primary Examiner*—Howard L. Williams
*Assistant Examiner*—Jean B. Jeanglaude
*Attorney, Agent, or Firm*—Martine Penilla & Kim, LLP

[57] ABSTRACT

A digital-to-analog converter with differential output voltage includes a resistor string with high and low reference voltages end nodes and with nodes located between adjacent resistors of the string, first switches of a first analog multiplexer for deriving first divided voltages from first nodes of the resistor string, second switches of a second analog multiplexer for deriving second divided voltages from second nodes of the resistor string, and a decoder device receiving a digital signal. The decoder device is coupled to the first switches for selecting the first switches according to a first code derived from a first bit portion of the digital signal, and the decoder device is coupled to the second switches for selecting the second switches according to a second code derived from a second bit portion of the digital signal different to the first bit portion, whereby a selected first divided voltage and a selected second divided voltage define a selected differential output voltage of the converter. The decoder device includes two separate decoders each for deriving the first and second codes, and the first multiplexer and second multiplexer are switched only one at a time.

20 Claims, 4 Drawing Sheets

| DIGITAL INPUT 110 | d[1] 170 | d[1:0] 172 | d[1:0]+1 172b | (d[1:0]+1)>>1 172c | CLOSED SWITCHES 176 | d[2] 174 | $V_{OUTN} \rightarrow V_{OUTP}$ 178 |
|---|---|---|---|---|---|---|---|
| 111 | 1 | 11 | 100 | 10 | S1n,S2p | 1 | -3 |
| 110 | 1 | 10 | 11 | 1 | S1n,S1p | 1 | -2 |
| 101 | 0 | 01 | 10 | 1 | S0n,S1p | 1 | -1 |
| 100 | 0 | 00 | 01 | 0 | S0n,S0p | 1 | (-)0 |
| 000 | 0 | 00 | 01 | 0 | S0n,S0p | 0 | (+)0 |
| 001 | 0 | 01 | 10 | 1 | S0n,S1p | 0 | +1 |
| 010 | 1 | 10 | 11 | 1 | S1n,S1p | 0 | +2 |
| 011 | 1 | 11 | 100 | 10 | S1n,S2p | 0 | +3 |

FIG. 5

DIFFERENTIAL VOLTAGE DIGITAL-TO-ANALOG CONVERTER

CROSS REFERENCE TO RELATED APPLICATIONS

This application claims the benefit of U.S. Provisional Patent Application having Ser. No. 60/060,692, filed on Sep. 23, 1997, entitled "Improved Differential Resistor String Digital to Analog Converter." This application is hereby incorporated by reference.

TECHNICAL FIELD

The present invention relates generally to digital-to-analog converters and, more specifically, to a differential voltage digital-to-analog converter.

BACKGROUND OF THE INVENTION

Digital-to-analog converters are used to convert a digital input signal to an analog output signal. The simplest technique used to build a voltage scaling digital-to-analog converter (DAC) uses a series of resistors (a "resistor string") connected between two supply voltages to serve as a multi-step voltage divider. Such a resistor string DAC is illustrated in FIG. 1. Switches (analog multiplexer) controlled by the digital input signal then select a node between two resistors of the resistor string to serve as the analog voltage output signal. Such a resistor string DAC that uses an N-bit digital input requires $2^N$ equal resistors and $2^N$ switches.

More particularly, FIG. 1 illustrates a prior art DAC 10 for a 3-bit digital input. A resistor string has eight resistors R0 through R7 connected in series. One end of the string is connected to a low reference voltage $V_{REFN}$ (usually ground), and the other end is connected to a high reference voltage $V_{REFP}$ (supply). The resistor string acts as a voltage divider to provide intermediate voltages ranging from $V_{REFN}$ to $V_{REFP}$ at nodes between the resistors. A 3-bit digital input signal or "code" represents one of eight discrete values or "states". This 3-bit input is decoded in a decoder (not shown) that is used to activate one of the switches S0 through S7, thereby selecting a voltage to provide an analog output $V_{OUT}$. These switches S0 through S7 are typically CMOS transistor switches.

The advantages of this design include simplicity, low cost and its inherent monotonicity. A DAC is said to be monotonic if, for increasing input values, the device yields strictly increasing output values. In other words, whatever resistor matching is achieved in the fabrication process for this design and whatever is the targeted resolution, the transfer characteristics of the DAC are ensured to be strictly monotonic. The resolution of a device refers to the number of bits in the input code and determines the smallest change possible in the output analog signal for a DAC. A DAC with more bits in its input code will have a higher resolution. For example, an N-bit code will have $2^N$ quantization levels and $2^{N-1}$ steps between levels. Even a poor matching of resistors on a given chip, the resolution will not be greatly affected. By "matching" it is meant that the resistors are preferably of the same resistance value but, due to manufacturing variations, may have values that vary as much as 20% or more.

Even with very poor matching of the resistors, the DAC will still achieve a small Differential Linearity Error (DLE). For example, even with a 20% mismatching of resistance values, the DAC still yields a 0.2 least significant bit (LSB) DLE as a worst case. Linearity is a measure of accuracy, and the DLE measures the linearity between code transitions and is a measure of monotonicity. However, a monotonic device does not necessarily have to be linear. In the DAC of FIG. 1, the impedance of the CMOS switches does not affect the linearity of the DAC. A drawback of the DAC of FIG. 1 is that the for increased resolution the hardware requirement (number of resistors and switches) grows exponentially, which leads to increased costs and increased space requirements.

In most mixed-signal products, i.e. products which integrate on the same silicon die very complex digital circuitry next to the analog cells needed for the application (for example audio and radio interfaces for telecommunication products) for the purpose of reducing system costs by avoiding the need for separate digital and analog chips, differential voltage signaling is mandatory on the analog circuitry in order to reduce the coupling effects from the switchings on the digital part. While in single-ended circuitry a signal is referred to a ground reference that is usually the negative power supply of the application, in differential circuitry a signal is defined as the difference between two symmetrical nodes (i.e. two outputs of opposite polarity, and the output signal will be the voltage difference between these two outputs). As mentioned, differential voltage signaling is mandatory with mixed-signal products for reducing the negative capacitive and inductive coupling effects between digital and analog signals which are mutually physically closely arranged. This is particularly true in the case of a "single-tub" process, where analog and digital parts have to share a common bulk.

A common solution for converting the resistor string DAC of FIG. 1 from single-ended voltage signaling to differential voltage signaling includes providing two analog multiplexers with complementary select control in order to provide a differential voltage output $V_{OUTP}/V_{OUTN}$. Such an implementation requires $2^N$ equal resistors and on the order of $2^N$ switches for the each of the multiplexers for an N-bit resolution. FIG. 2 shows a differential 3-bit resistor string DAC 20 offering this type of solution, including eight resistors R0 through R7 connected in series, with one end of the string connected to a low reference voltage $V_{REFN}$ (usually ground), and the other end connected to a high reference voltage $V_{REFP}$ (supply). A first multiplexer 22 includes switches (typically CMOS transistor switches) S-3p through S3p and a second multiplexer 24 includes switches (typically CMOS transistor switches) S-3n through S3n. A 3-bit digital input signal or "code" represents one of eight discrete values or "states". This 3-bit input is decoded in a decoder (not shown) that is used to simultaneously activate one of the switches of each one of the multiplexers 22 and 24, thereby to select a voltage on each side of the resistor string to provide an analog differential voltage output defined by $V_{OUTP}$ and $V_{OUTN}$.

In order to reduce the number of components and corresponding size requirements of an N-bit differential resistor string DAC of the type of FIG. 2, it is possible to replace each of the two N bit multiplexers (i.e. each with on the order of $2^N$ switches) with an N-1 bit multiplexer (i.e. with on the order of $2^{N-1}$ switches), and to add a switching matrix which receives as input the two multiplexer outputs. The two N-1 bit multiplexers may be simultaneously controlled by the decoded N-1 least significant bits (LSBs) of the digital input code (d[N-2:0]), while the input matrix may be controlled by the most significant bit (MSB) of the digital input code (d[N-1]), thereby corresponding to a sign and amplitude code. The sign and amplitude code for the case of a 3-bit signal, in which the sign is determined by the 1st bit (MSB) and the amplitude is determined by all other bits (N-1 LSBs), is thus: −3:111; −2:110; −1:101; 0:100=000; +1:001; +2:010; +3:011. With such a modification, the number of required switches is advantageously divided by (on the order of) two, such that an N-bit resolution for the differential voltage output only requires on the order of $2^N$ switches and $2^N$ resistors.

FIG. 3 shows an improved differential 3-bit resistor string DAC 30 of this type, including eight resistors R0 through R7 connected in series, with one end of the string connected to a low reference voltage $V_{REFN}$ (usually ground), and the other end connected to a high reference voltage $V_{REFP}$ (supply). A first 3-bit multiplexer 32 includes switches (typically CMOS transistor switches) S0p through S3p and a second 3-bit multiplexer 34 includes switches (typically CMOS transistor switches) S0n through S3n. The outputs of the multiplexers 32 and 34 are connected as input to a switching matrix 36. A 3-bit digital input signal or "code" represents one of eight discrete values or "states". This 315 bit input is decoded in a decoder (not shown), and the 2 least significant bits (LSBs) of the digital input code (d[1:0]) simultaneously control the first and second multiplexers 32 and 34 to simultaneously select a respective voltage at each one of the multiplexers 32 and 34. The two least significant bits of the digital input code provide four discrete values or states which select the four switch combinations including: S0n and S0p; S1n and S1p; S2n and S2p; and S3n and S3p. The selected voltages from each of the multiplexers 32 and 34 are input into switching matrix 36, which is controlled by the most significant bit (MSB) of the digital input code (d[2]) to provide an analog differential voltage output $V_{OUTP}-V_{OUTN}$ ranging in relative value between −3, −2, −1, 0, +1, +2, and +3 (seven voltage values).

While the differential voltage DAC 30 of FIG. 3 indeed reduces the component requirements with respect to the differential voltage DAC 20 of FIG. 2, it would still be desirable to even further reduce the component requirements in differential voltage digital-to-analog converters.

SUMMARY OF THE INVENTION

In accordance with one preferred aspect of the present invention, in a differential voltage resistor string DAC, the switching of a first multiplexer is performed independently from the switching of a second multiplexer in such a manner which permits to reduce the number of resistances and switch requirements of the DAC.

In one preferred embodiment of the invention, a decoder device adapted to receive a digital input signal is coupled to a first plurality of switches of a first multiplexer for selecting the first plurality of switches according to a first code derived from a first bit portion of the digital signal to obtain a selected first divided voltage from a resistor string coupled between a low and high reference voltage, and the decoder device is coupled to a second plurality of switches of a second multiplexer for selecting the second plurality of switches according to a second code derived from a second bit portion of the digital signal different to the first bit portion to obtain a selected second divided voltage from the resistor string. Preferably, with a digital signal having N bits, the first bit portion is equivalent to the N-2 mean bits of the digital signal while the first code is equal to the value of the N-2 mean bits, and the second bit portion is equivalent to the N-1 least significant bits of the digital signal while the second code is equal to a rounded-down value of the N-1 least significant bits incremented by 1 and divided by 2.

In another preferred embodiment of the invention, a decoder device adapted to receive a digital input signal is coupled to a first plurality of switches of a first multiplexer for selecting the first plurality of switches according to a first code derived from a first bit portion of the digital signal to obtain a selected first divided voltage from a resistor string coupled between a low and high reference voltage, and the decoder device is coupled to a second plurality of switches of a second multiplexer for selecting the second plurality of switches according to a second code derived from a second bit portion of the digital signal different to the first bit portion to obtain a selected second divided voltage from the resistor string. Preferably, only one of the first and second codes changes when the value of the digital signal in accordance with a sign and amplitude representation is incremented or decreased by one.

With respect to a differential voltage DAC having a pair of switch multiplexers which are simultaneously controlled by the same decoded control signal, the differential voltage DAC in accordance with the present invention advantageously provides twice the number of different output voltages when using the same component hardware with regard to the resistors and switches, or alternatively the number of resistors and switches which are required are advantageously reduced substantially in half when the same resolution (number of output voltages) is desired, so as to provide for a more compact and less complex design.

BRIEF DESCRIPTION OF THE DRAWINGS

The invention, together with further advantages thereof, may best be understood by reference to the following description taken in conjunction with the accompanying drawings in which:

FIG. 5 is a table showing a preferred scheme of control codes, closed switches and differential output voltages for a 3-bit digital input signal for the DAC of FIG. 4.

DETAILED DESCRIPTION OF THE PREFERRED EMBODIMENTS

Figure 1:
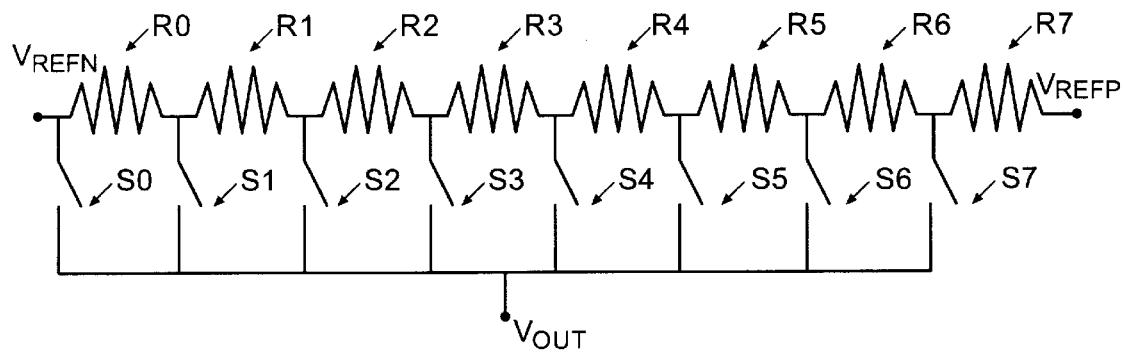
FIG. 1 is a schematic diagram of a voltage-scaling DAC with single voltage output, described above.
Figure 2:
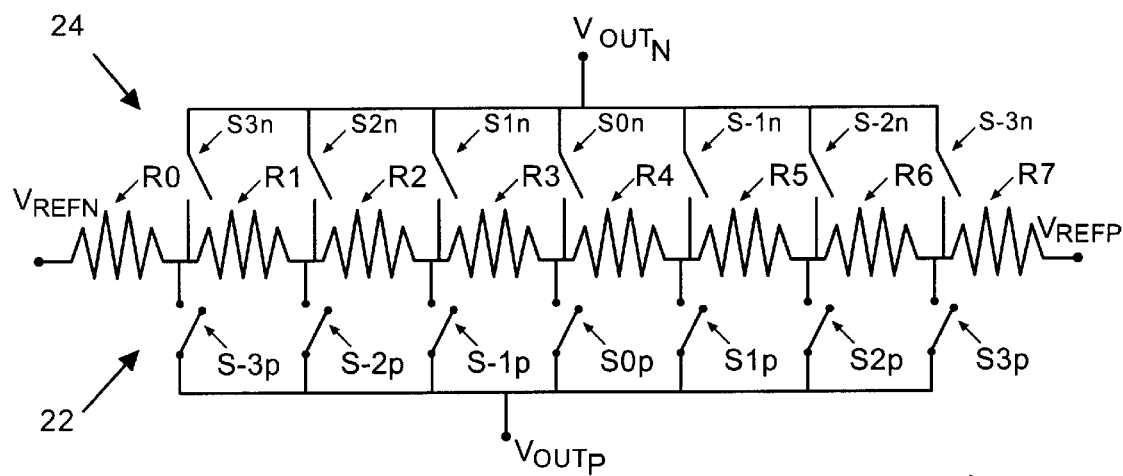
FIG. 2 is a schematic diagram of a voltage-scaling DAC with differential voltage output, described above.
Figure 3:
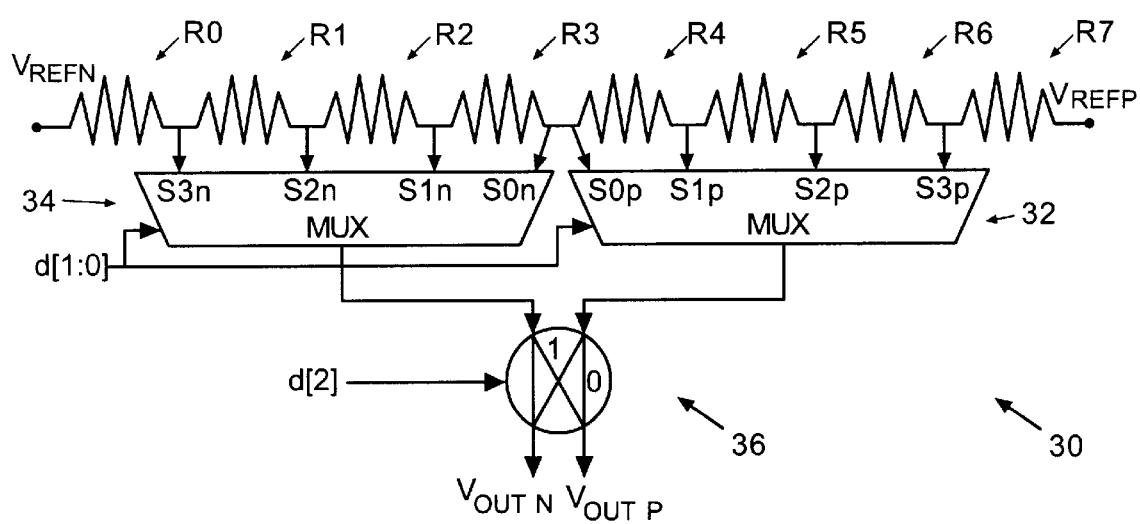
FIG. 3 is a schematic diagram of a voltage-scaling DAC with differential voltage output and reduced switch multiplexers, described above.
Figure 4:
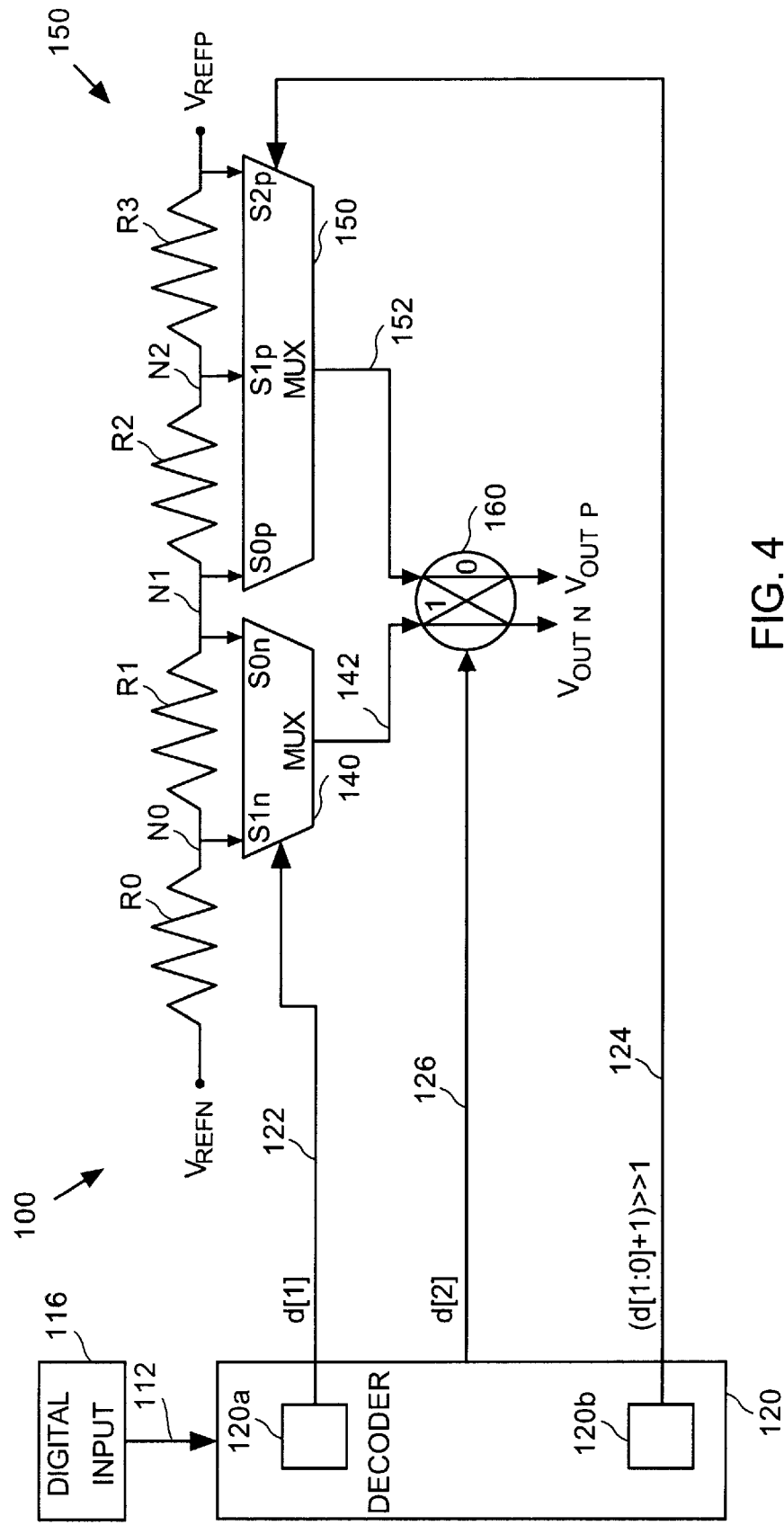
FIG. 4 is a schematic diagram of a voltage-scaling DAC with differential voltage output according to one preferred embodiment of the present invention.

The digital-to-analog converters of FIGS. 1, 2, and 3 were discussed above. FIG. 4 shows at 100 a 3-bit differential voltage resistor string DAC according to one preferred embodiment of the present invention. While reference is made below in particular to the application of the invention to a 3-bit DAC (3-bit input code), it will be apparent to a person skilled in the art that the principles of the present invention may be easily applied to DACs having an input code with any number of bits.

DAC 100 includes a digital input 110, a decoder device 120, a resistor string 130, a first multiplexer 140, a second multiplexer 150, and a switching matrix 160. Resistor string 130 includes resistors R0, R1, R2, and R3 coupled in series, and defining nodes N0, N1, and N2 between respective adjacent resistor pairs. Resistors R0, R1, R2, and R3 all preferably have a substantially equal resistance value. A low reference voltage node $V_{REFN}$ is defined at one end of resistor string 130 for being connected to a low reference voltage (typically ground), and a high reference voltage node $V_{REFP}$ is defined at the other end of resistor string 130 for being connected to a high reference voltage. First multiplexer 140 includes first switches S0n and S1n arranged for selectively tapping nodes N0 and N1 respectively in order to selectively derive first divided voltages from resistor string 130, and second multiplexer 150 includes second switches S0p, S1p, and S2p arranged for selectively tapping nodes N1, N2, and $V_{REFP}$ respectively in order to selectively derive second divided voltages from resistor string 130. Switches S0n, S1n, S0p, S1p, and S2p are typically conventional CMOS transistor switches.

Decoder device 120 is connected to first multiplexer 140 with input 122, while second multiplexer 150 receives input 124 from decoder device 120. Decoder device 120 receives 3-bit digital input 110 via input 112 and according to a first code derived from the 3-bit digital input 110, decoder device 120 controls first multiplexer 140 so as to selectively close only one of switches S0n and S1n thereby to obtain a selected first divided voltage corresponding to the node N0 or N1 of the closed switch of first multiplexer 140. Additionally, according to a second code (different from the above first code) derived from the 3-bit digital input 110, decoder device 120 controls second multiplexer 150 so as to selectively close only one of switches S0p, S1p, and S2p thereby to obtain a selected second divided voltage corresponding to the node N1 or N2 or $V_{REFP}$ of the closed switch of second multiplexer 150. The selected first and second divided voltages are input from first and second multiplexers 140 and 150 respectively through input lines 142 and 152 to switching matrix 160.

Due to the tapping configuration of switches S0n, S1n, S0p, S1p, and S2p on resistor string 130 (including switches S0n and S0p tapping the same node N1), the first and second divided voltages as selected in the above manner define an analog differential output voltage which may assume any one of four discreet values ranging from 0, 1, 2, and 3. According to a third code (different from the above first and second codes) derived from the 3-bit digital input 110, decoder device 120 controls switching matrix 160 which then operates to select the sign (+ or −) of the discreet values of the analog differential output voltage selected by multiplexers 140 and 150, thereby to obtain a final analog differential output voltage for DAC 100 defined by voltage outputs $V_{OUTP}$ and $V_{OUTN}$ of switching matrix 160 which may assume any one of seven discreet values ranging from −3, −2, −1, 0, +1, +2, and +3.

The first code for controlling first multiplexer 140 is preferably derived from a first bit portion of 3-bit digital input 110, which first bit portion is preferably equivalent to the mean bit (d[1]) of 3-bit digital input 110. For an N-bit digital input, the first bit portion would be equivalent to all of the N-2 mean bits of the code (d[N-2:1]).

The second code for controlling second multiplexer 150 is preferably derived from a second bit portion (different from the above first bit portion) of 3-bit digital input 110, which second bit portion is preferably equivalent to the two least significant bits (d[1:0]) of 3-bit digital input 110. For an N-bit digital input, the second bit portion would be equivalent to all of the N-1 least significant bits of the code (d[N-2:0]). The second code for controlling second multiplexer 150 is preferably equal to a rounded-down value of: the value of the two least significant bits of 3-bit digital input 110 incremented by 1 and divided by 2 ((d[1:0]+1)>>1). For an N-bit digital input, the second code would be equal to a rounded-down value of: the value of the N-1 least significant bits of the N-bit digital input incremented by 1 and divided by 2 ((d[N-2:0]+1)>>1). Essentially, the second code is obtained by adding 1 to the digital value of all of the LSBs of the digital input to obtain an intermediate digital value, and subsequently truncating the LSB from the intermediate digital value.

Decoder device 120 preferably includes a first decoder 120a for deriving the first control code in the above described manner for first multiplexer 140, and a second decoder 120b separate from first decoder 120a for deriving the second control code in the above described manner for second multiplexer 140.

The third code for controlling switching matrix is preferably derived from a third bit portion (different from the above first and second bit portions) of 3-bit digital input 110, which third bit portion is preferably equivalent to the most significant bit (d[2]) of 3-bit digital input 110. For an N-bit digital input, the third bit portion would be equivalent to the most significant bit of the code (d[N-1]).

FIG. 5 shows, for the 3-bit DAC of FIG. 4, a preferred scheme of the codes 170, 172, and 174 generated in the above manner by decoder device 120, the subsequent combination of closed switches 176 of multiplexers 140 and 150, and the corresponding final analog differential output voltages 178 obtained for each of the possible eight values of 3-bit digital input 110. The first code 170 equivalent to the mean bit (d[1]) of 3-bit digital input 110 operates such that the "state" 0 closes switch S0n while the "state" 1 closes switch S1n of multiplexer 140. The second code 172 is derived by taking the LSBs (d[1:0]) of 3-bit digital input 110 in a first step 172a, adding 1 to the value of the LSBs from first step 172a in a second step 172b (d[1:0]+1), and dividing the value obtained in second step 172b by 2 and subsequently rounding off the divided value in a third step 172c ((d[1:0]+1)>>1) (equivalent to truncating the LSB of the digital code corresponding to the value obtained in first step 172a), to obtain the final second code input to second multiplexer 150. Such second code 172 controls second multiplexer 150 such that the "state" 0 closes switch S0p, the "state" 1 closes switch S1p, and the "state" 1:0 closes the switch S2p of multiplexer 150. From FIG. 5 it will be appreciated that only one of first code 170 and second code 172 changes, and thus the switches of only one of first multiplexer 140 and second multiplexer 150 changes for obtaining an "interweaving" switching scheme, when the value of digital signal 110 in accordance with a sign and amplitude representation is incremented or decreased by one.

The combination of closed switches 176 includes S0n and S0p, S0n and S1p, S1n and S1p, and S1n and S2p, for providing analog differential output voltages of four values ranging from 0, 1, 2, and 3. The third code 176 equivalent to the most significant bit (d[2]) of 3-bit digital input 110 input into switching matrix operates such that the "state" 0 gives positive values for the four differential output voltages while the "state" 1 gives negative values for the four differential output voltages. In this manner, DAC 100 provides for an analog differential voltage output 178 ($V_{OUTP}$−$V_{OUTN}$) ranging in relative value between −3, −2, −1, 0, +1, +2, and +3 (seven voltage values). Such differential voltage output values 178 obtained with 3-bit DAC 100 are equivalent to those obtained in the 3-bit DAC 30 of FIG. 3, however while requiring only four resistors (as opposed to eight in DAC 30) and only five switches (as opposed to eight in DAC 30).

The differential voltage DAC according to the present invention allows to decrease the resistor and switch requirements while the hardware required to implement the switching scheme (increment/shift right operations i.e. N-1 Carry Generators) is not significant when compared to the such resistor and switch savings. Moreover, the floorplan typically used to layout the DAC resistor sting is such as to easily allow the routing of two sets of control lines from the two decoders to the two multiplexers to command the switches. In addition, the inherent monotocity of the DAC resistor string is fully preserved: there is no matching requirement between any of the resistors of the string to guarantee a monotonic characteristic on the DAC. The conductance of the multiplexer switches also will not affect the monotocity of the DAC. Other techniques used to reduce the hardware count of the DAC, such as for example the use of programmable resistors in the string, rely on component matching and also require switches with low impedance compared to that of the resistors.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

What is claimed is:

1. A digital-to-analog converter with differential output voltage comprising:

a resistor string formed by a plurality of resistors coupled in series such that a high reference voltage node is defined at one end of said resistor string for being connected to a high reference voltage, and such that a low reference voltage node is defined at another end of said resistor string for being connected to a low reference voltage, and such that a plurality of nodes is defined each node of which is located between a respective adjacent pair of resistors of said plurality of resistors coupled in series;

a first plurality of switches for deriving first divided voltages from first nodes of said plurality of nodes;

a second plurality of switches for deriving second divided voltages from second nodes of said plurality of nodes; and a decoder device configured to receive a digital signal, said decoder device being coupled to said first plurality of switches for selecting said first plurality of switches according to a first code derived from a first bit portion of said digital signal to obtain a selected first divided voltage of said first divided voltages, and said decoder device being coupled to said second plurality of switches for selecting said second plurality of switches according to a second code derived from a second bit portion of said digital signal different to said first bit portion to obtain a selected second divided voltage of said second divided voltages, said selected first divided voltage and said selected second divided voltage define a selected differential output voltage of the converter;

wherein said digital signal comprises N bits, and said first bit portion is equivalent to the N-2 mean bits of said digital signal while said first code is equal to the value of said N-2 mean bits, and said second bit portion is equivalent to the N-1 least significant bits of the digital signal while said second code is equal to a rounded-down value of said N-1 least significant bits incremented by 1 and divided by 2.

2. The digital-to-analog converter according to claim 1 wherein said decoder device comprises a first decoder for receiving said digital signal and coupled to said first plurality of switches for controlling said first plurality of switches according to said first code, and wherein said decoder device further comprises a second decoder for receiving said digital signal and coupled to said second plurality of switches for controlling said second plurality of switches according to said second code.

3. The digital-to-analog converter according to claim 1 wherein the switches of said first and second plurality of switches comprise CMOS transistors.

4. The digital-to-analog converter according to claim 1 wherein only one of said first and second codes changes when the value of the digital signal in accordance with a sign and amplitude representation is incremented or decreased by 1.

5. The digital-to-analog converter according to claim 1 wherein said decoder device comprises a first decoder for deriving said first code and a second decoder separate from said first decoder for deriving said second code.

6. The digital-to-analog converter according to claim 1 wherein said first nodes are located at a first end of said plurality of resistors coupled in series and said second nodes are located at a second end of said plurality of resistors coupled in series.

7. The digital-to-analog converter according to claim 6 wherein said first nodes and said second nodes each comprise a common middle node.

8. The digital-to-analog converter according to claim 1, further comprising a switching matrix configured to receive said selected first divided voltage and said selected second divided voltage, said decoder device being coupled to said switching matrix for providing said selected differential output voltage according to a third code derived from a third bit portion of said digital signal.

9. The digital-to-analog converter according to claim 8 wherein said digital signal comprises N bits, and said first bit portion is equivalent to the N-2 mean bits of said digital signal, and said second bit portion is equivalent to the N-1 least significant bits of the digital signal while said second code is equal to a rounded-down value of said N-1 least significant bits incremented by 1 and divided by 2, and said third bit portion is equivalent to the most significant bit of the digital signal.

10. The digital-to-analog converter according to claim 9 wherein said decoder device comprises a first decoder for receiving said digital signal and coupled to said first plurality of switches for controlling said first plurality of switches according to said first code, and wherein said decoder device further comprises a second decoder for receiving said digital signal and coupled to said second plurality of switches for controlling said second plurality of switches according to said second code, and wherein said decoder device further comprises an inverter coupled to said switching matrix for controlling said switching matrix according to said third bit portion of said digital signal.

11. A digital-to-analog converter with differential output voltage comprising:

a resistor string formed by a plurality of resistors coupled in series such that a high reference voltage node is defined at one end of said resistor string for being connected to a high reference voltage, and such that a low reference voltage node is defined at another end of said resistor string for being connected to a low reference voltage, and such that a plurality of nodes is defined each node of which is located between a respective adjacent pair of resistors of said plurality of resistors coupled in series;

a first plurality of switches for deriving first divided voltages from first nodes of said plurality of nodes;

a second plurality of switches for deriving second divided voltages from second nodes of said plurality of nodes; and a decoder device configured to receive a digital signal, said decoder device being coupled to said first plurality of switches for selecting said first plurality of switches according to a first code derived from said digital signal to obtain a selected first divided voltage of said first divided voltages, and said decoder device being coupled to said second plurality of switches for selecting said second plurality of switches according to a second code derived from said digital signal and different from said first code to obtain a selected second divided voltage of said second divided voltages, said selected first divided voltage and said selected second divided voltage define a selected differential output voltage of the converter;

wherein said digital signal comprises N bits, and said first code is equal to the value of the N-2 mean bits of said digital signal, and said second code is equal to a rounded-down value of the N-1 least significant bits of the digital signal incremented by 1 and divided by 2.

12. The digital-to-analog converter according to claim 11 wherein said decoder device comprises a first decoder for receiving said digital signal and coupled to said first plurality of switches for controlling said first plurality of switches according to said first code, and wherein said decoder device further comprises a second decoder for receiving said digital signal and coupled to said second plurality of switches for controlling said second plurality of switches according to said second code.

13. The digital-to-analog converter according to claim 11 wherein only one of said first and second codes changes when the value of the digital signal in accordance with a sign and amplitude representation is incremented or decreased by 1.

14. An N-bit digital-to-analog converter (DAC) comprising:

$2^{(N-1)}$ resistors coupled in series ranging from a resistor R(0) to a resistor R($2^{N-1}-1$), thereby defining $2^{(N-1)}-1$ nodes between adjacent resistors ranging from N(0) to N($2^{N-1}-2$), where resistor R(0) has a low reference voltage end node for being connected to a low reference voltage, and resistor R($2^{N-1}-1$) has a high reference voltage end node for being connected to a high reference voltage;

a first set of $2^{(N-2)}$ CMOS transistors ranging from CN($2^{(N-2)}-1$) to CN(0) for deriving first divided voltages from first nodes of said nodes;

a second set of $2^{(N-2)}+1$ CMOS transistors ranging from CP($2^{(N-2)}$) to CP(0) for deriving second divided voltages from second nodes of said nodes; and a decoder device configured to receive an N-bit digital signal, said decoder device being coupled to said first plurality of switches for selecting said first plurality of switches according to a first code derived from said N-bit digital signal to obtain a selected first divided voltage of said first divided voltages, and said decoder device being coupled to said second plurality of switches for selecting said second plurality of switches according to a second code derived from said N-bit digital signal and different from said first code to obtain a selected second divided voltage of said second divided voltages, wherein said selected first divided voltage and said selected second divided voltage define a selected differential output voltage of the converter;

wherein said first code is equal to the value of the N-2 mean bits of said N-bit digital signal, and said second code is equal to a rounded-down value of the N-1 least significant bits of the N-bit digital signal incremented by 1 and divided by 2.

15. The N-bit digital-to-analog converter (DAC) according to claim 14 wherein the CN(0) transistor and the CP(0) transistor are both connected to the same middle node.

16. The N-bit digital-to-analog converter (DAC) according to claim 15 wherein the CN($2^{(N-2)}-1$) transistor is connected to the N(0) node, and the CP($2^{(N-2)}$) transistor is connected to the high reference voltage end node.

17. The N-bit digital-to-analog converter (DAC) according to claim 15 wherein the CN($2^{(N-2)}-1$) transistor is connected to the high reference voltage end node, and the CP($2^{(N-2)}-1$) transistor is connected to the N(0) node.

18. A method for digital-to-to analog conversion using a resistor string formed by a plurality of resistors coupled in series, a high reference voltage node being defined at one end of said resistor string and a low reference voltage node being defined at another end of said resistor string, a plurality of nodes being defined each node of which is located between a respective adjacent pair of resistors of said plurality of resistors coupled in series, a first plurality of switches arranged for deriving first divided voltages from first nodes of said plurality of nodes, and a second plurality of switches arranged for deriving second divided voltages from second nodes of said plurality of nodes, the method comprising the steps of:

connecting a high reference voltage to said high reference voltage node and connecting a low reference voltage to said low reference voltage node;

decoding a digital signal;

deriving a first code from a first bit portion of said digital signal and selecting said first plurality of switches according to said first code and obtaining a selected first divided voltage, said first code being equal to a value of N-2 mean bits of said digital signal;

deriving a second code from a second bit portion of said digital signal and selecting said second plurality of switches according to said second code and obtaining a selected second divided voltage, said second code being equal to a rounded-down value of N-1 least significant bits incremented by 1 and divided by 2; and obtaining a selected differential output voltage of the converter according to said selected first divided voltage and said selected second divided voltage.

19. The method of claim 18 wherein said digital signal has N-bits.

20. The method of claim 18 comprising incrementing or decreasing the value of said digital signal in accordance with a sign and amplitude representation by 1 and subsequently changing only one of said first and second codes.

* * * * *